United States Patent [19]

Kähkipuro

[11] Patent Number: 4,753,323

[45] Date of Patent: Jun. 28, 1988

[54] SAFETY SYSTEM FOR CLOSING DOORS

[75] Inventor: Matti Kähkipuro, Hyvinkää, Finland

[73] Assignee: Kone Elevator GmbH, Baar, Switzerland

[21] Appl. No.: 53,865

[22] Filed: May 26, 1987

[30] Foreign Application Priority Data

May 26, 1986 [FI] Finland ................................ 862219

[51] Int. Cl.⁴ .............................................. B66B 13/26
[52] U.S. Cl. ............................ 187/52 LC; 187/52 R; 187/104; 49/26
[58] Field of Search .................. 187/104, 103, 52 R, 187/52 LC, 56, 51; 49/25, 26, 27

[56] References Cited

U.S. PATENT DOCUMENTS 3,017,957  1/1962  Lund et al. .................... 187/104 X
3,370,677  2/1968  Federmann et al. ............ 187/104 X

FOREIGN PATENT DOCUMENTS 213308   3/1987  European Pat. Off. ............. 187/56
52394   12/1977  Finland .
8202536  8/1982  World Int. Prop. O. ......... 187/52 R
8703100  5/1987  World Int. Prop. O. ......... 187/52 R Primary Examiner—H. Grant Skaggs
Assistant Examiner—Nik E. Pedersen
Attorney, Agent, or Firm—Sughrue, Mion, Zinn, Macpeak and Seas

[57] ABSTRACT

A capacitive safety system for controlling a door, e.g. an elevator door, so as to automatically avoid obstacles, employs electronic control for antennas operating as capacitive measuring elements for establishing shield voltages of identical phase on the antennas and on shield voltage antennas to counteract ambient capacity variations. In order to improve the operation and safety of the elevator door, the elevator shaft door, which closes simultaneously with the elevator door, is provided with similar capacitive measuring antennas and electronic controls as the elevator door, as well as with similar shield voltage antennas, which operate on a shield voltage having the same phase as that of the elevator door. Operation of the elevator shaft door and the elevator door with identical phases is effected by means of a wireless shield voltage transfer unit.

4 Claims, 2 Drawing Sheets

SAFETY SYSTEM FOR CLOSING DOORS

FIELD OF THE INVENTION

The present invention relates to a capacitive safety system for a door such as an elevator door, which automatically avoids an obstacle, the system including antennas operating as capacitors.

DESCRIPTION OF THE PRIOR ART

It is common practice to construct safety systems to prevent persons using an elevator from being caught between the doors, or preferably to preclude any collision of the door with people. In fact, accidents associated with automatic doors have recently increased in number, and with product liability legislation becoming more strict it is necessary for manufacturers to pay even more attention to door safety systems. Such apparatus may involve mechanical sensors, photocells, ultrasonic devices, and sensors based on capacitive measurement, the latter being those which are the most advantageous with respect to their technical implementation. Among their advantages may be mentioned the fact that they can be built into the door structure; and furthermore their reliability, because they have no mechanical components.

In Finnish Pat. No. 53294, for instance, there is disclosed a capacitive sensor for automatic doors which includes at least two antennas placed in the door edge and which operate as capacitors, a voltage source from which a voltage is conducted to the antennas, and an amplifier to which the antennas are connected and which indicates, to means controlling the elevator door motor, any capacitive disturbances caused by obstacles in the path of closure of the doors. What was novel in the disclosure of the aforesaid patent was that measuring electronics of the capacitive antennas were provided with automatic tuning, so that only a differential voltage at the terminals of the amplifier, caused by a capacitive disturbance of varying magnitude during the closing movement of the elevator door, can control the means controlling the elevator door motor.

In this way there was obtained a simple and functioning safety strip, but all the same the sensitivity of this prior device was fairly modest. This was because of the interfering effect of the elevator shaft doors, since usually no systems corresponding to those on the elevator doors were installed on these doors. It has, however been realized, as disclosed in U.S. Pat. No. 3,017,957, that a safety system may also be provided on the door structures of the elevator shaft. However, the coupling between the shaft doors and the elevator doors, which is indispensable, has been carried out in an unsatisfactory way, that is, by means of mechanical contact. It is apparent that in modern safety systems a coupling of this type, which is subject to wear and requires maintenance, is not acceptable.

BRIEF SUMMARY OF THE INVENTION

It is accordingly an object of the present invention to improve the sensitivity of a safety system for a door by adding means for identification of obstacles to the elevator shaft doors without having to add any moving parts, or any other factors impairing safety, to the system.

The present invention provides a capacitive safety system for controlling doors so as to avoid obstacles, comprising a first sensor antenna, a first shield antenna, the first sensor antenna and the first shield antenna being provided on an elevator door, first electronic control means for establishing a shield voltage on the first sensor antenna and the first shield antenna for counteracting ambient capacity variations, a second sensor antenna, a second shield antenna, the second sensor antenna and the second shield antenna being provided on an elevator shaft door which opens and closes simultaneously with the elevator door, second electronic control means for establishing a shield voltage on the second sensor antenna and the second shield antenna for counteracting ambient capacity variations, and wireless means for transferring a signal corresponding to one of the shield voltages between the elevator door and the elevator shaft door to operate both of the doors with shield voltages of identical phase.

With the aid of the present invention, the elevator shaft doors are also enabled to sense an obstacle between the doors and the basic capacitance caused by the elevator shaft doors can be eliminated and the sensitivity even further improved.

The wireless means may comprise photoelectric components, e.g. optoisolators.

BRIEF DESCRIPTION OF THE DRAWINGS

Further objects, advantages and features of the present invention will be apparent from the following description thereof with reference to the accompanying drawings, in which.

DESCRIPTION OF THE PREFERRED EMBODIMENT

Figure 1:
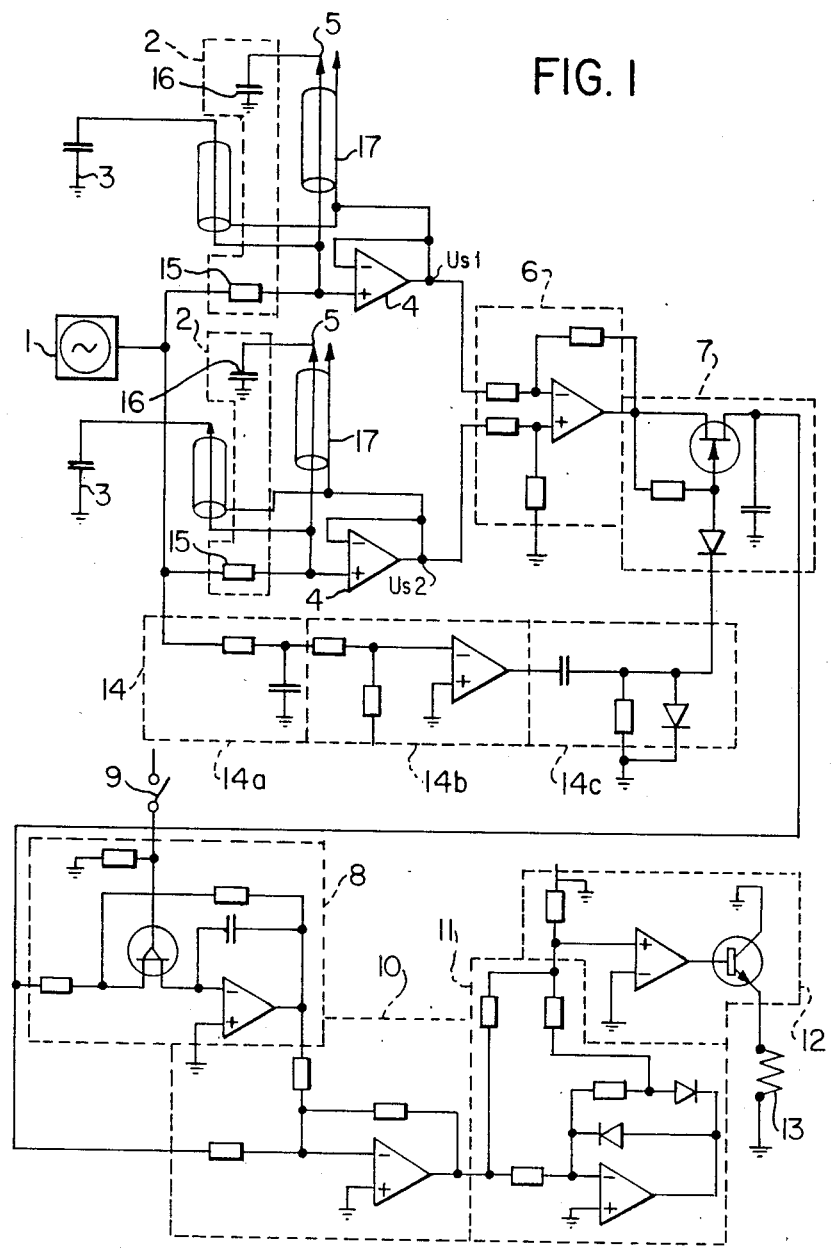
FIG. 1 shows a circuit diagram of a prior art system for part of one door.

An exemplary prior art system, disclosed in Finnish Pat. No. 53294, comprises, as shown in FIG. 1, an oscillator 1 generating a sinusoidal alternating voltage and having a frequency which is on the order of a few 10 kHz, for instance 20 kHz. The output signal of the oscillator 1 is conducted through high-impedance attenuators, 2, each consisting of a resistor 15 representing an antenna ground capacitance and a capacitor 16, to sensor antennas 3 and over operational amplifiers 4 to shield voltage antennas 5. Operational amplifiers 4 are provided, in voltage follower circuits known to those skilled in the art, and their outputs are connected to the sheaths of coaxial cables 17, a lead to the antenna being the central conductor in each coaxial cable. At the outputs of the amplifiers 4 appear shield voltages $U_{s1}$, $U_{s2}$, at least one of which is transferred by wireless means to the corresponding apparatus in the elevator shaft door.

The components to which the shield voltage is applied have low impedance and are at the same potential as the respective antennas 5. If the sensor antennas 3 were placed in the door edge without any shield voltage, the capacitive current between the antennas and the door would be high compared with the current caused by capacitive disturbances, with the consequence that high accuracy and stability requirements would be imposed on the mounting of the antennas. On the other hand, if beside the shield voltage a sensor antenna is applied, the component carrying shield voltage will not cause any change of the voltage of the sensor antenna 3, and an external capacity, when placed beside the component with the shield voltage, will not cause any change in the voltage of the component.

The shield voltages are connected to a differential amplifier 6, which is based on a well-known operational amplifier circuit. The output voltage of the amplifier 6 is zero if the external ground capacitance is the same in both antennas 3. If the antennas 3 are under the influence of a capacitance disturbance caused e.g. by a person or other like obstacle, there appears at the output of the amplifier 6 an alternating voltage having the frequency of the sinusoidal signal generated by the oscillator 1, its amplitude being proportional to the magnitude of the capacitance disturbance.

An FET-based, phase-sensing detector 7 and a synchronizing pulse forming circuit 14, which converts the output voltage of the detector 7 to a d.c. voltage, produce as their output a d.c. voltage the polarity of which depends on which one of the two antennas is being disturbed. The circuit 14 consists of a phase-shifting circuit 14a, a voltage measuring circuit 14b and a pulse modulating circuit 14c.

The system has an automatic tuner, comprising a switch 9, controllable by the state of motion of the elevator door, a setting/holding circuit 8 controlled thereby, and a summing amplifier 10. When the door is in the open position, the switch 9 is open and the output voltage of the setting/holding circuit 8 follows the control voltage from the detector 7. Since the gain of the setting/holding circuit 8 is −1, there is zero voltage at the output of the summing amplifier 10 when the switch 9 is in open position. As a result, the output voltage of the absolute value circuit 10 is also zero, and the control relay 13 permits closing of the doors, whereby their closing movement may begin even if there should be a voltage at the output of the phase-sensing amplifier 7, which reveals the presence of a capacitive disturbance.

When the closing movement of the elevator door starts, the switch 9 closes and the setting/holding circuit 8 retains in its memory the magnitude of the capacitive disturbance which was present when the closing motion began. If the voltage caused by the disturbance at the output of the detector 7 remains constant, the doors will close. If, however, during the closing movement the capacitive disturbance changes in magnitude, there appears at the output of the amplifier 10 a voltage, which is always converted into a negative voltage by the absolute value amplifier 11. When the voltage at the output of the amplifier 11 falls below a threshold value determined by the measuring circuit 12, the relay 13 interrupts the door-closing movement.

In the operational example just presented, the apparatus is automatically tuned with the aid of the components 8, 10 and 11 when the switch 9 is open. In this way the capacitive disturbances reducing the tuning sensitivity, which remain constant during the closing movement, are eliminated. Such disturbances are, for instance, wetting of the door edge, changes in the antennas due to received blows, and manufacturing inaccuracies of the antennas. In the case of double doors a separate system is required for each elevator door. In implementing the present invention, it is moreover possible to double the system so as to provide it also on the respective elevator shaft doors.

Figure 2:
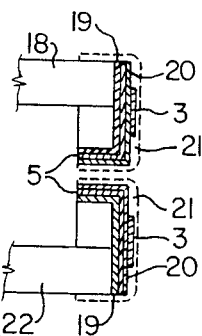
FIG. 2 shows a view in cross-section through a safety system embodying the invention, as installed on an elevator door and an elevator shaft door.

In FIG. 2 there is illustrated the more detailed structural design of the antenna system. On an elevator door 18 there has been fixed an insulating plate 19, to which has further been affixed a plate 5 carrying shield voltage. On the other side of this plate is provided an insulating plate 20, upon which the antenna 3 is mounted. Outermost on the edge of the elevator cage door is a shield 21 of insulating material. A similar arrangement is provided on an elevator shaft door 22.

Figure 3:
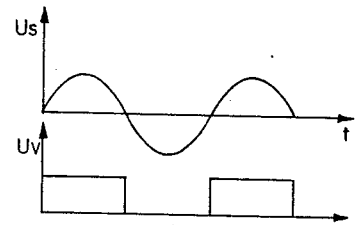
FIG. 3 illustrates the principle of optical transfer of a shield voltage.

In FIG. 3 there is displayed the shield voltage on the elevator door side, the phase information of which is transferred in a wireless manner to the elevator shaft door. With, for example, optoisolators one can in principle simply produce a pulsating voltage $U_v$ at the elevator shaft door, from which a shield voltage consistent in phase with $U_s$ can be formed for the safety strip system on the elevator shaft door.

Figure 4:
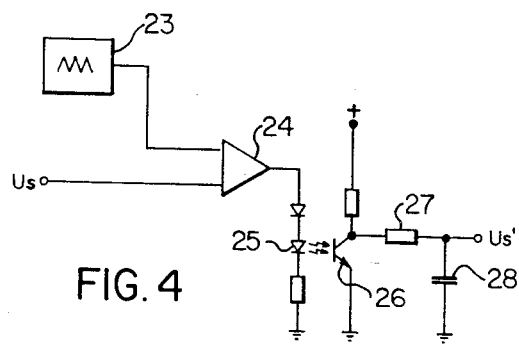
FIG. 4 shows an embodiment of means for effecting wireless signal transfer between the elevator door and the elevator shaft door.
Figure 5:
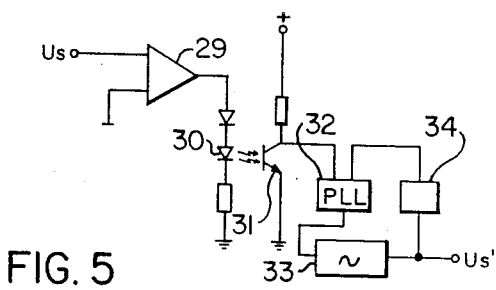
FIG. 5 shows another embodiment of means for effecting wireless signal transfer between the elevator door and the elevator shaft door.

In FIGS. 4 and 5, there are accordingly shown two apparatus for implementing this arrangement. In FIG. 4 there is shown an example of wireless phasing between the elevator doors and the elevator shaft doors utilizing pulse width modulation. A modulating signal is derived from a sawtooth wave generator 23, and supplied to an operational amplifier 24 serving as a comparator, the signal to be modulated, i.e., the shield voltage $U_s$, also being supplied to the amplifier 24. A photodiode 25 transmits the then modulated sinusoidal signal over the gap between the elevator doors and the elevator shaft doors to a phototransistor 26, the signal from this being filtered by an RC circuit comprising a resistor 27 and a capacitor 28 to form a sinusoidal wave $U_s'$, which has the same phase as $U_s$. This circuit can be implemented entirely with conventional components; the most difficult requirements are set for the optoisolator itself, which has to manage a transfer rate of about 100 kHz if the frequency of the shield voltage is 20 kHz. However, selection of a proper optoisolator type causes no problems to a person skilled in the art. In FIG. 5 there is shown another example of wireless phasing between the elevator doors and the elevator shaft doors utilizing a phase-locked loop (PLL) and a sinusoidal oscillator. The shield voltage $U_s$ is supplied to an operational amplifier 29, which supplies the suitably amplified signal to a photodiode 30, which in the above-described manner (FIG. 3) optically transmits the phase signal across the gap between the elevator doors and the elevator shaft doors to a phototransistor 31. The transistor controls a phase-locked loop 32, and this in its turn controls a sinusoidal oscillator 33. The oscillator may be a twice integrating and inverting circuit implemented with operational amplifiers, which from a sinusoidal input signal produces a sinusoidal voltage $U_s$ according to well-known techniques.

It will be apparent to those persons skilled in the art that different embodiments of the invention are not confined to the examples presented above and that they may vary within the scope of the claims following below. For instance, the invention is not limited to any particular mode of signal transfer using optoisolators between the elevator doors and the elevator shaft doors, and any kind of wireless data transfer can be contemplated.

I claim:

1. A capacitive safety system for controlling doors so as to avoid obstacles, comprising:
   a first sensor antenna;
   a first shield antenna;
   said first sensor antenna and said first shield antenna being provided on an elevator door;
   first electronic control means for establishing a shield voltage on said first sensor antenna and said first shield antenna for counteracting ambient capacity variations;
   a second sensor antenna;
   a second shield antenna;
   said second sensor antenna and said second shield antenna being provided on an elevator shaft door which opens and closes simultaneously with said elevator door;
   second electronic control means for establishing a shield voltage on said second sensor antenna and said second shield antenna for counteracting ambient capacity variations; and
   wireless means for transferring a signal corresponding to one of said shield voltages between said elevator door and said elevator shaft door to operate both of said doors with shield voltages of identical phase.

2. A capacitive safety system as claimed in claim 1, wherein said wireless means comprise photoelectric components (25, 26, 30, 31).

3. A capacitive safety system as claimed in claim 2, including means (23, 24) for pulse width modulating said shield voltage (Us') prior to the transfer of said signal by said wireless means, said wireless means comprising optoisolator means (25, 26) for transferring said pulse width modulated signal, and filter means (27, 28) for producing a sinusoidal alternating voltage (Us') from the transferred signal.

4. A capacitive safety system as claimed in claim 2, wherein said wireless means comprise optoisolator means (30, 31) for transferring said signal as a half-wave rectified signal and oscillator means (33) responsive to the transferred signal are provided for producing a sinusoidal alternating voltage (Us') in response thereto.

* * * * *